United States Patent
Tomimatsu

(10) Patent No.: US 6,933,172 B2
(45) Date of Patent: Aug. 23, 2005

(54) SEMICONDUCTOR WAFER WITH SPACER AND ITS MANUFACTURING METHOD, SEMICONDUCTOR DEVICE AND ITS MANUFACTURING METHOD, AND CIRCUIT SUBSTRATE AND ELECTRONIC DEVICE

(75) Inventor: Hiroyuki Tomimatsu, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 60 days.

(21) Appl. No.: 10/370,618

(22) Filed: Feb. 24, 2003

(65) Prior Publication Data

US 2003/0162324 A1 Aug. 28, 2003

(30) Foreign Application Priority Data

Feb. 25, 2002 (JP) ........................................ 2002-048320

(51) Int. Cl.[7] ........................ H01L 21/44; H01L 21/48; H01L 21/50
(52) U.S. Cl. ........................ 438/109; 438/126; 438/113
(58) Field of Search ................................. 438/106, 109, 438/127, 107

(56) References Cited

U.S. PATENT DOCUMENTS

| | | | | |
|---|---|---|---|---|
| 5,627,108 A | * | 5/1997 | Alibocus et al. | 228/175 |
| 5,736,453 A | * | 4/1998 | Kadonishi | 438/460 |
| 5,744,827 A | | 4/1998 | Jeong et al. | |
| 5,776,799 A | * | 7/1998 | Song et al. | 438/118 |
| 5,904,497 A | * | 5/1999 | Akram | 438/106 |
| 5,918,113 A | * | 6/1999 | Higashi et al. | 438/119 |
| 6,124,152 A | * | 9/2000 | Yim | 438/126 |
| 6,258,626 B1 | * | 7/2001 | Wang et al. | 438/107 |
| 6,294,825 B1 | | 9/2001 | Bolken et al. | |
| 6,333,562 B1 | * | 12/2001 | Lin | 257/777 |
| 6,413,797 B2 | * | 7/2002 | Oka et al. | 438/108 |
| 6,455,353 B2 | * | 9/2002 | Lin | 438/113 |
| 6,458,623 B1 | * | 10/2002 | Goldmann et al. | 438/107 |
| 6,458,681 B1 | * | 10/2002 | DiStefano et al. | 438/612 |
| 6,461,893 B2 | * | 10/2002 | Hyoudo et al. | 438/106 |
| 6,503,776 B2 | * | 1/2003 | Pai et al. | 438/106 |
| 6,506,681 B2 | * | 1/2003 | Grigg et al. | 438/692 |
| 6,569,709 B2 | * | 5/2003 | Derderian | 438/109 |
| 6,593,171 B2 | * | 7/2003 | Farnworth | 438/127 |
| 6,617,198 B2 | * | 9/2003 | Brooks | 438/118 |
| 6,627,998 B1 | * | 9/2003 | Caletka et al. | 257/778 |
| 6,630,736 B1 | * | 10/2003 | Ignaut | 257/737 |
| 6,649,444 B2 | * | 11/2003 | Earnworth et al. | 438/108 |
| 6,710,455 B2 | * | 3/2004 | Goller et al. | 257/777 |
| 2003/0038355 A1 | * | 2/2003 | Derderian | 257/686 |
| 2003/0176018 A1 | * | 9/2003 | Derderian | 438/109 |
| 2004/0007782 A1 | * | 1/2004 | Hedler et al. | 257/783 |

* cited by examiner

*Primary Examiner*—Olik Chaudhuri
*Assistant Examiner*—Michael K. Luhrs
(74) *Attorney, Agent, or Firm*—Oliff & Berridge, PLC

(57) ABSTRACT

The invention provides a method for forming spacers very productively. A method for manufacturing a semiconductor wafer includes forming spacers on a plurality of semiconductor chips arranged in a plane on a substrate, respectively. The steps of forming the multiple spacers are conducted collectively on the substrate.

34 Claims, 9 Drawing Sheets

SEMICONDUCTOR WAFER WITH SPACER AND ITS MANUFACTURING METHOD, SEMICONDUCTOR DEVICE AND ITS MANUFACTURING METHOD, AND CIRCUIT SUBSTRATE AND ELECTRONIC DEVICE

BACKGROUND OF THE INVENTION

1. Field of Invention

The present invention relates to semiconductor wafers with spacers and methods for manufacturing the same, semiconductor devices and methods for manufacturing the same, circuit substrates and electronic devices.

2. Description of Related Art

The related art includes semiconductor devices in which a plurality of semiconductor chips are stacked one on top of the other. The related art also includes such devices with a configuration in which electrical connections are provided by bonding electrodes of the semiconductor chips to wires. When a semiconductor chip having the same or a greater outer shape than that of another semiconductor chip is stacked one on top of the other, a spacer needs to be provided between the semiconductor chips.

The related art includes a method of potting a resin on the semiconductor chip to form a spacer. However, since the potting amount determines a height of the resin, it is difficult to control the height and width of the spacer. Also, the related art includes a method in which a silicon member or molding resin is formed into a specified shape, and is then mounted on a semiconductor chip. However, the productivity of this method is poor because, for example, each spacer is positioned with respect to each of the semiconductor chips.

SUMMARY OF THE INVENTION

The present invention addresses and/or solves the above and/or other problems, and provides a method for forming spacers, which enhances productivity.

A method for manufacturing a semiconductor wafer with spacers in accordance with the present invention includes forming spacers on semiconductor elements on a semiconductor wafer, respectively. The steps of forming the multiple spacers are collectively conducted on the semiconductor wafer.

In accordance with the present invention, because a plurality of spacers are collectively formed on a semiconductor wafer, the productivity is extremely high. In other words, the time of individually mounting spacers on semiconductor elements can be eliminated, and therefore the spacers can be quickly and readily formed.

In the semiconductor wafer with spacers, each spacer may be formed inside a surface of the semiconductor element.

As a result, the surface area of the spacer can be made small. Accordingly, for example, even when it has physical values different from those of a material used to seal the semiconductor device, the internal stress of the semiconductor device can be reduced.

In the semiconductor wafer with spacers, the step of forming the spacers may include:

setting a mold having a plurality of holes to the wafer;

providing paste that is a material for the spacers within the respective holes; and separating the mold from the wafer to thereby form the multiple spacers.

As a result, by providing the paste in the plural holes formed in the mold, a plurality of spacers can be formed collectively.

In the semiconductor wafer with spacers, the mold may have a dam section that stops flow of the paste. The paste may be provided in a space surrounded by the dam section within the hole.

As a result, even when a material that is apt to flow is used, spacers having a specified width can be readily formed.

In the semiconductor wafer with spacers, the paste may be provided flush with a surface of the mold.

As a result, by providing the paste flush with a surface of the mold, spacers having a specified height can be readily formed.

In the semiconductor wafer with spacers, the paste may be a resin.

In the semiconductor wafer with spacers, the paste may have a thixotropic ratio that is greater than a thixotropic ratio of a mold sealing material.

In the semiconductor wafer with spacers, the step of forming the spacers may include:

providing a photosensitive material for the spacers on the wafer; and exposing and developing the material to thereby form the multiple spacers.

Accordingly, by exposing and developing the material, a plurality of spacers can be formed collectively.

In the semiconductor wafer with spacers, the material may have a positive type or negative type property.

In the semiconductor wafer with spacers, the material may be provided by a spin coat method.

As a result, the material can be formed in a uniform thickness. Accordingly, spacers having a specified height can be readily formed.

In the semiconductor wafer with spacers, the step of forming the spacers may include:

adhering a sheet of material for the spacers to a tape; and transferring a plurality of portions of the sheet from the tape to the semiconductor wafer to thereby form the multiple spacers.

As a result, by transferring the sheet adhered to the tape, a plurality of spacers can be formed collectively.

In the semiconductor wafer with spacers, before the step of transferring, an adhesive strength between the tape and the plurality of portions may be made smaller than an adhesive strength between the tape and other portions of the sheet.

As a result, the sheet can be partially transferred onto the semiconductor wafer.

In the semiconductor wafer with spacers, the tape may have a property to be hardened by an ultraviolet ray.

In the semiconductor wafer with spacers, before the step of transferring, an ultraviolet ray may be irradiated on the tape at regions thereof to which the plurality of portions of the sheet are bonded.

As a result, the sheet can be readily peeled partially.

In the semiconductor wafer with spacers, before the step of transferring, the sheet may be cut over the tape along outlines of the plurality of portions of the sheet.

As a result, the sheet can be readily peeled partially.

A method for manufacturing a semiconductor device in accordance with the present invention includes: forming spacers on a plurality of semiconductor chips that are arranged in a plane on a substrate. The steps of forming the multiple spacers are conducted collectively on the substrate.

In accordance with the present invention, since the steps of forming a plurality of spacers are collectively conducted on the substrate, the productivity is extremely high. In other words, the time of individually mounting spacers on semiconductor elements can be eliminated, and spacers can be quickly and readily formed.

In the method for manufacturing a semiconductor device, each spacer may be formed inside a surface of the semiconductor chip.

As a result, the surface area of the spacer can be made small. Accordingly, for example, even when it has physical values different from those of a material used to seal the semiconductor device, the internal stress of the semiconductor device can be reduced.

In the method for manufacturing a semiconductor device, the step of forming the spacers may include:
setting a mold having a plurality of holes to the substrate;
providing paste that is a material for the spacers within the respective holes; and
separating the mold from the substrate to thereby form the multiple spacers.

As a result, by providing the paste in the plural holes formed in the mold, a plurality of spacers can be formed collectively.

In the method for manufacturing a semiconductor device, the mold may have a dam section that stops flow of the paste. The paste may be provided in a space surrounded by the dam section within the hole.

As a result, even when a material that is apt to flow is used, spacers having a specified width can be readily formed.

In the method for manufacturing a semiconductor device, the paste may be provided flush with a surface of the mold.

As a result, by providing the paste flush with a surface of the mold, spacers having a specified height can be readily formed.

In the method for manufacturing a semiconductor device, the paste may be a resin.

In the method for manufacturing a semiconductor device, the paste may have a thixotropic ratio that is greater than a thixotropic ratio of a mold sealing material.

In the method for manufacturing a semiconductor device, the step of forming the spacers may include:
providing a photosensitive material for the spacers on at least a plurality of the semiconductor chips; and
exposing and developing the material to thereby form the multiple spacers.

Accordingly, by exposing and developing the material, a plurality of spacers can be formed collectively.

In the method for manufacturing a semiconductor device, the material may have a positive type or negative type property.

In the method for manufacturing a semiconductor device, the material may be provided by a spin coat method.

As a result, the material can be formed in a uniform thickness. Accordingly, spacers having a specified height can be readily formed.

In the method for manufacturing a semiconductor device, the step of forming the spacers may include:
adhering a sheet of material for the spacers to a tape; and
transferring a plurality of portions of the sheet from the tape to the semiconductor chips to thereby form the multiple spacers.

As a result, by transferring the sheet adhered to the tape, a plurality of spacers can be formed collectively.

In the method for manufacturing a semiconductor device, before the step of transferring, an adhesive strength between the tape and the plurality of portions may be made smaller than an adhesive strength between the tape and other portions of the sheet.

As a result, the sheet can be partially transferred onto the semiconductor wafer.

In the method for manufacturing a semiconductor device, the tape may have a property to be hardened by an ultraviolet ray.

In the method for manufacturing a semiconductor device, before the step of transferring, an ultraviolet ray may be irradiated on the tape at regions thereof to which the plurality of portions of the sheet are bonded.

As a result, the sheet can be readily peeled partially.

In the method for manufacturing a semiconductor device, before the step of transferring, the sheet may be cut over the tape along outlines of the plurality of portions of the sheet.

As a result, the sheet can be readily peeled partially.

The method for manufacturing a semiconductor device may further include wire-bonding electrodes of the semiconductor chips to wiring patterns of the substrate.

In the method for manufacturing a semiconductor device, before the step of wiring bonding, the step of forming the spacers may be conducted.

In the method for manufacturing a semiconductor device, after the step of wiring bonding, the step of forming the spacers may be conducted.

The method for manufacturing a semiconductor device may further include forming a collective body of a plurality of stacked type semiconductor devices by repeating the step of forming the spacers for a plurality of semiconductor chips in a second stage or over that are stacked over the substrate.

As a result, the step of forming the spacers for a plurality of semiconductor chips in a second stage or over are collectively conducted over the substrate. As a result, the time for moving semiconductor chips after forming spacers to a substrate is omitted, and therefore semiconductor devices can be manufactured in a reduced or minimum number of manufacturing steps.

The method for manufacturing a semiconductor device may further include forming a sealing section that seals a plurality of the stacked semiconductor chips on the substrate.

The method for manufacturing a semiconductor device may further include cutting the sealing section and the substrate, after the step of sealing, to form a plurality of individual stacked type semiconductor devices.

A semiconductor wafer with spacers in accordance with the present invention includes:
a semiconductor wafer having a plurality of semiconductor elements; and
spacers provided on the respective semiconductor elements.

In the semiconductor wafer with spacers, each spacer may be formed inside a surface of the semiconductor element.

A semiconductor device in accordance with the present invention includes:
a substrate having a wiring pattern;
a plurality of semiconductor chips arranged in a plane on the substrate;
spacers that are provided on the respective semiconductor chips.

A semiconductor device in accordance with the present invention includes:

a substrate having a wiring pattern;

a plurality of semiconductor chips arranged in a plane and stacked in three dimensions on the substrate; and spacers that are provided between the semiconductor chips that are stacked in three dimensions.

In the semiconductor wafer with spacers, the spacer may be formed inside a surface of the semiconductor chip.

In the semiconductor wafer with spacers, the semiconductor chip may have electrodes, and the electrodes and the wiring pattern of the substrate may be wire-bonded.

In the semiconductor wafer with spacers, a sealing section that seals a plurality of the stacked semiconductor chips may be formed on the substrate.

In the semiconductor wafer with spacers, the sealing section and the substrate may be cut into individual stacked type semiconductor devices.

A circuit substrate in accordance with the present invention has the aforementioned semiconductor device mounted thereon.

An electronic device in accordance with the present invention has the aforementioned semiconductor device.

DETAILED DESCRIPTION OF PREFERRED EMBODIMENTS

Exemplary embodiments of the present invention are described below with reference to the accompanying drawings. However, the present invention is not limited to the exemplary embodiments described below.

(First Exemplary Embodiment)

Figure 1:
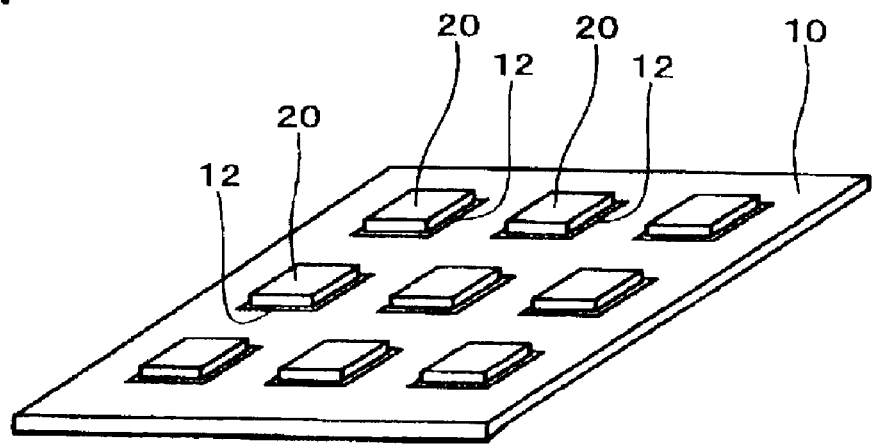
FIG. 1 is a schematic that shows a method for manufacturing a semiconductor device in accordance with a first exemplary embodiment of the present invention.

FIGS. 1–8 show a method for manufacturing a semiconductor device in accordance with a first exemplary embodiment of the present invention. First, as shown in FIG. 1, a plurality of semiconductor chips 20 are mounted on a substrate 10. The substrate 10, when cut into individual pieces, serves as an interposer of a semiconductor device.

The substrate 10 may be formed with an organic material (polyimide substrate) or an inorganic material (ceramic substrate, glass substrate), or may be formed with a composite structure of these materials (glass epoxy substrate). The plane configuration of the substrate 10 is not limited, but may often be in a rectangular configuration. The substrate 10 may be formed of a single layer substrate or a multiple-layer substrate.

The substrate 10 is provided with a plurality of mounting regions 12 to mount a plurality of semiconductor chips 20. The mounting regions 12 may be provided on one or both of the surfaces of the substrate 10. In the example shown in FIG. 1, the plurality of mounting regions 12 are arranged on a surface of the substrate 10 in multiple rows and multiple columns (a matrix configuration).

The substrate 10 has a wiring pattern 14 formed of multiple wirings (see FIG. 3(A)). More specifically, the wiring pattern 14 is formed in each of the mounting regions 12. The substrate 10 may be provided with a plurality of through holes 16 to electrically connect one surface to the other surface thereof (see FIG. 3(A)). The through holes 16 may be embedded with a conductive material, or may be plated on their inner wall surfaces to define through holes. By so doing, electrical connections may be made from both surfaces of the substrate 10.

The semiconductor chip 20 can be any shape, and can be, for example, a rectangular solid (including cubic) configuration as shown in FIG. 1. The semiconductor chip 20 includes an integrated circuit (not shown) formed of transistors and memory elements. The semiconductor chip 20 includes at least one electrode (plural electrodes in many cases) (not shown) that is electrically connected to the integrated circuit. The electrodes may be formed in end sections of the surface of the semiconductor chip 20, near two or four of the sides of the exterior configuration, or may be formed in a central section of the surface. The electrodes may be formed from aluminum metal or copper metal. Also, a passivation film (not shown) is formed over the semiconductor chip 20 to cover the end section while avoiding central portions of the electrodes. The passivation film may be formed of, for example, $SiO_2$, SiN, polyimide resin or the like.

As shown in FIG. 1, the semiconductor chips 20 are mounted on the plurality of mounting regions 12 of the substrate 10, respectively. The plurality of semiconductor chips 20 are arranged in plane on the substrate 10. The semiconductor chips 20 are bonded with their electrodes facing upward (in face-up bonding). The semiconductor chips 20 may be adhered to the substrate 10 with an adhesive.

Figure 2:
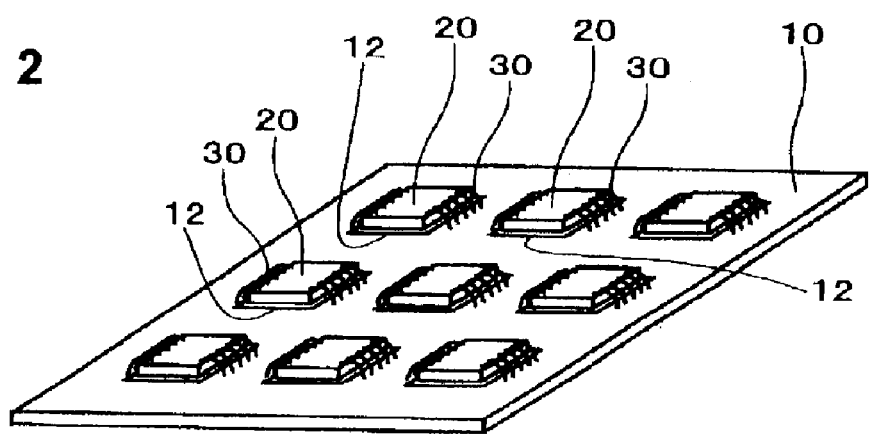
FIG. 2 is a schematic that shows the method for manufacturing a semiconductor device in accordance with the first exemplary embodiment of the present invention.

As shown in FIG. 2, the semiconductor chips 20 are electrically connected to the wiring patterns 14. The electrical connections of the two can be made with wires 30. In this case, a ball-bump method may be used. More specifically, tip portions of the wires 30 that are led outside a tool (for example, a capillary) may be fused into balls, and the tip portions may be thermocompression-bonded to the electrodes (preferably accompanied by ultrasonic vibrations) to electrically connect the wires 30 to the electrodes. In this case, the wires 30 may be bonded to the wiring patterns 14 on the substrate 10, after the wires 30 have been bonded to the electrodes of the semiconductor chips 20.

In accordance with a modified example of the embodiment, the wires 30 may be first bonded to the wiring patterns 14 on the substrate 10, and then bonded to the electrodes of the semiconductor chips 20. In this manner, by leading out the wires 30 from a lower position to a higher position, the loop height of the wires 30 can be lowered. When the electrodes of the semiconductor chip 10 are subject to a second bonding, bumps may preferably be provided on the electrodes in advance. By so doing, the reliability in electrical connection between the wires 30 and the electrodes can be enhanced without damaging the electrodes that serve as base layers.

As shown in FIGS. 3(A)–3(C), each of the semiconductor chips 20 is provided with a spacer 50. In the present embodiment, a printing method is employed to provide a plurality of spacers 50 at one time. The spacer 50 is provided on a top surface (i.e., a surface where electrodes are formed) of the semiconductor chip 20. For example, the spacer 50 may be provided inside the surface of the semiconductor chip 20 (see FIG. 4). For example, the spacer 50 may be provided in a region closer to a central section of the surface of the semiconductor chip 20 with respect to the plural electrodes formed at end sections thereof. As a result, the surface area of the spacer 50 can be made smaller. For this reason, for example, even when the spacer has a physical value (for example, a thermal expansion coefficient) that is different from that of a material used to seal the semiconductor device (for example, a material used for a transfermold), the internal stress of the semiconductor device can be reduced. Alternatively, the spacer 50 may be provided in a manner to extend outside the surface of the semiconductor chip 20. When the spacer 50 is provided after the wire-bonding step, part of the wires 30 may be covered by paste 49. The spacer 50 is formed thicker (higher) than the height of the wires 30.

The paste 49 may preferably be a dielectric material, and for example, may be a resin. Also, the thixotropic ratio of the paste 49 may preferably be greater than the thixotropic ratio of a mold sealing material (for example, a material used for a transfer mold (for example, resin). By so doing, print failures can be reduced or eliminated such that the spacer 50 can be securely formed on the semiconductor chip 20.

As shown in FIG. 3(A), a mold 40 is set at a surface of the substrate 10 where the semiconductor chip 20 is mounted. The mold 40 is a mask (or a screen) that is patterned into a specified plane configuration. By providing the paste 49 that is a material for the spacer 50 in a space formed in the mold 40, the spacer 50 is formed on the semiconductor chip 20.

The mold 40 includes a plurality of holes 42 to provide the paste 49 therein. In the example shown in FIG. 3(A), each one of the holes 42 corresponds to each one of the semiconductor chips 20, respectively. By setting the mold 40 on the substrate 10, spaces to house the paste 49 therein are formed on the substrate 10. As shown in FIG. 3(A), a plane configuration of an opening of the hole 42 may be contained inside the surface of the semiconductor chip 20. By so doing, a region where the paste 49 is pushed out is contained inside the surface of the semiconductor chip 20, such that the spacer 50 can be more readily provided inside the surface of the semiconductor chip 20. The plane configuration of the hole 42 is not limited, and may be for example rectangular or circular.

As shown in FIG. 3(A), the mold 40 may have a dam section 44 that stops a flow of the paste 49 (i.e., a flow that expands in a width direction of the substrate). In the example shown in FIG. 3(A), the dam section 44 is formed at an outer circumference of the hole 42 that is contained inside the surface of the semiconductor chip 20, and extending in a height direction of the semiconductor chip 20. When the mold 40 is set on the substrate 10, the dam section 44 may be in contact with the surface of the semiconductor chip 10. By providing the dam section 44, the spacer 50 having a specified width can be readily formed even when the paste 49 is apt to flow (i.e., has a large thixotropic ratio). Conversely, by selecting a material that is difficult to flow (having a small thixotropic ratio) as the paste 49, the dam section 44 can be omitted. The dam section 44 is provided simply according to the plane configuration of the spacer 50.

Figure 3:
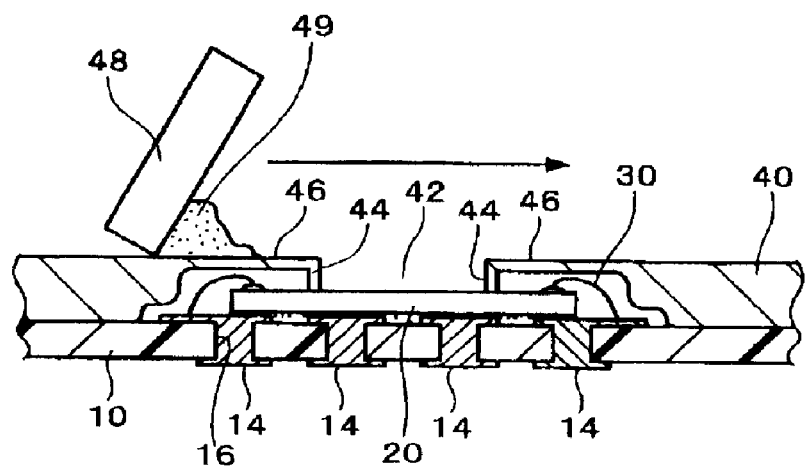
FIGS. 3(A)–3(C) are schematics that show the method for manufacturing a semiconductor device in accordance with the first exemplary embodiment of the present invention.
Figure 3:
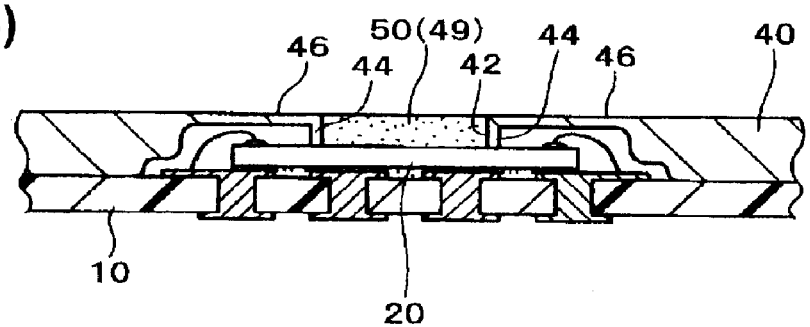
Figure 3:
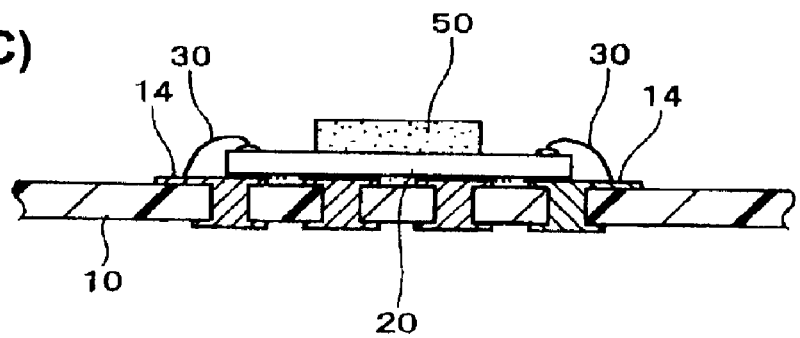

As shown in FIG. 3 (A), the mold 40 on the side of the substrate 10 has a three dimensional configuration (a concave section in FIG. 3 (A)) that avoids a convex section on the substrate 10 (for example, the semiconductor chip 20, wires 30, wiring patterns 14 and the like). By forming portions of the mold 40 on the side of the substrate 10 in a manner to avoid the wires 30, the step of forming the spacers 50 can be conducted after the wire-bonding step. In accordance with a modified example, the step of forming the spacers 50 may be conduced before the wire-bonding step. The mold 40 may be formed into a specified three-dimensional configuration by an etching method (half or full etching).

As shown in FIG. 3(A), the mold 40 is set on the substrate 10, and the holes 42 are disposed over the semiconductor chips 20. Then, the paste 40 is provided on the mold 40, and the paste 49 is uniformly placed in the hole 42 by a pushing member (for example, a squeegee) 48, such that it becomes flush with the surface of the mold 40.

In this manner, as shown in FIG. 3(B), the paste 49 is provided in the multiple holes 42 of the mold 40. In this case, the paste 49 may be filled in the entire space (a portion surrounded by the dam section 44 in FIG. 3(A)), or in a part of the space. The paste 49 becomes flush with a surface 46 (on the opposite side surface of the substrate 10) of the mold 40. In other words, the height of the surface of the paste 49 is the same as the height of the surface of the mold 40. Accordingly, by deciding the height of the surface of the mold 40, the spacers 50 having a specified height can be readily formed.

As shown in FIG. 3(C), the mold 40 is separated from the substrate 10 such that the multiple spacers 50 can be provided on the plural semiconductor chips 20.

According to this method, by providing the paste 49 in the plurality of holes 42 formed in the mold 40, the multiple spacers 50 are formed at one time. Also, since the paste 49 is directly provided to necessary portions, the material is not wasted, and the cost is therefore reduced.

Figure 4:
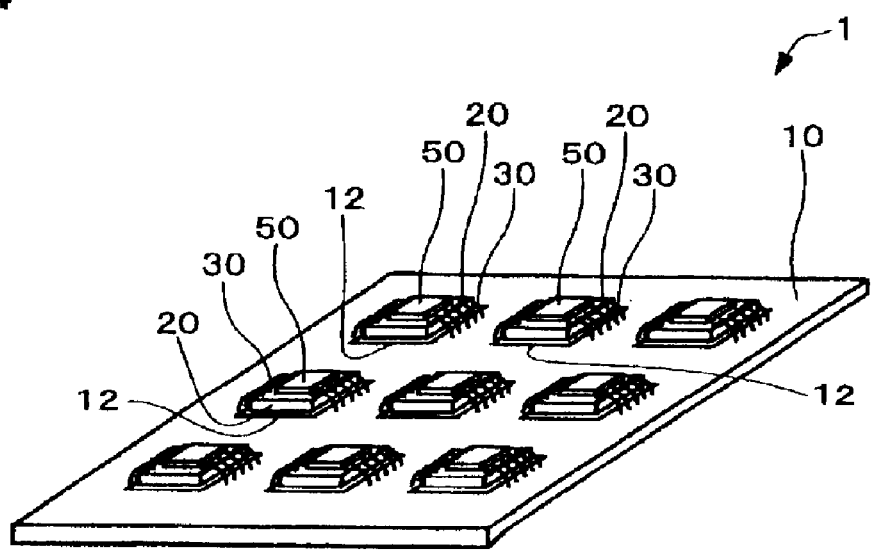
FIG. 4 is a schematic that shows a semiconductor device and the method for manufacturing a semiconductor device in accordance with the first exemplary embodiment of the present invention.
Figure 5:
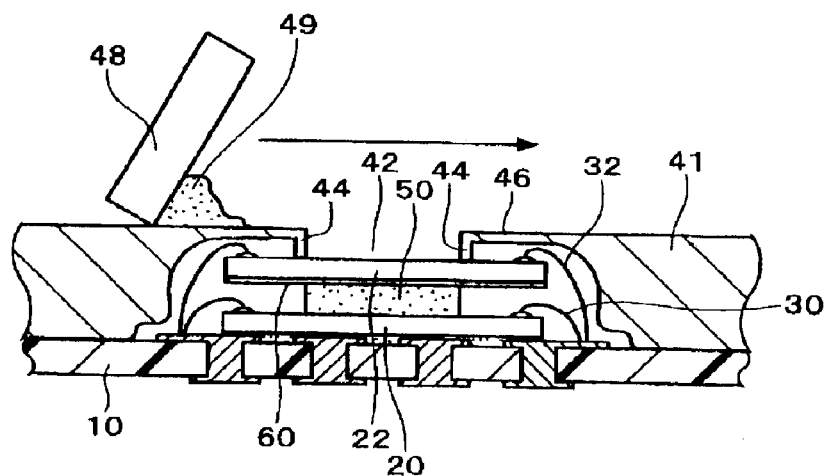
FIGS. 5(A) and 5(B) are schematics that show the method for manufacturing a semiconductor device in accordance with the first exemplary embodiment of the present invention.
Figure 5:
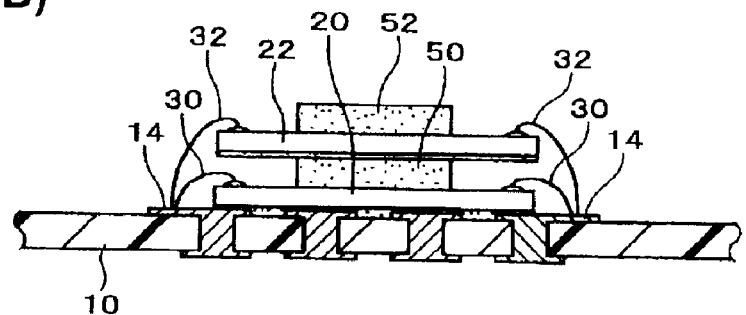

In the manner described above, the spacers 50 can be formed on the respective plurality of semiconductor chips 20 on the substrate 10. The semiconductor device 1 includes the substrate 10, as shown in FIG. 4, the semiconductor chips 20 arranged in plane on the substrate 10, and the spacers 50 that are provided on the respective semiconductor chips 20. It does not matter whether or not the spacers 50 have an adhesive function.

Next, as shown in FIG. 5(A) and FIG. 5(B), a plurality of other semiconductor chips 22 are stacked on the plurality of semiconductor chips 20 arranged in plane, and the above described steps are repeated for the respective semiconductor chips 22, to thereby provide spacers 52.

As shown in FIG. 5(A), the semiconductor chip 22 is subject to bonding on the semiconductor chip 20 with its electrodes facing upward. More specifically, the semiconductor chip 22 is mounted on the spacer 50. For example, the semiconductor chip 22 may be fixed on the spacer 50 by an adhesive (for example, an adhesive sheet) 60 that is adhered to a rear surface (a surface facing the substrate 10) of the semiconductor chip 22. An adhesive provided on the entire rear surface of the semiconductor chip 22 can reduce or prevent short-circuits between the semiconductor chip 22 and the wires 30. Thereafter, the semiconductor chip 22 and the wiring pattern 14 are electrically connected by, for example, wires 32.

Then, a mold 41 is set at the substrate 10, and a paste 49 is provided within a hole 42 by using the pushing member 48. As indicated in FIG. 5(A), when a dam section 44 is formed, the paste 49 is filled in a space surrounded by the dam section 44. Then, the paste 49 is provided flush with a surface 46 of the mold 41.

Then, as shown in FIG. 5(B), the mold 41 is separated from the substrate 10 such that a plurality of spacers 52 are provided on the respective plurality of semiconductor chips 22 at one time.

Figure 6:
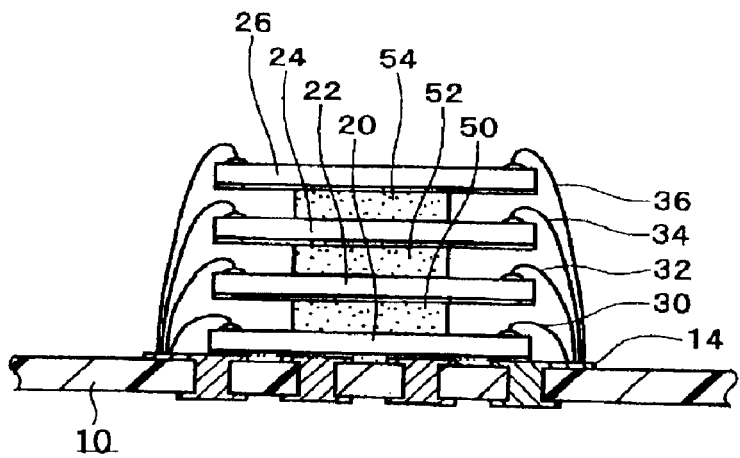
FIG. 6 is a schematic that shows a semiconductor device and the method for manufacturing a semiconductor device in accordance with the first exemplary embodiment of the present invention.

As shown in FIG. 6, the steps described above are repeated a plurality of times to thereby form a collective body of a plurality of semiconductor devices with stacked structure. Two or more semiconductor chips are stacked one on top of the other on the substrate 10. In the example shown in FIG. 6, four semiconductor chips 20, 22, 24 and 26 are stacked in three dimensions, wherein spacers 50, 52 and 54 are provided between the semiconductor chips in their height direction.

According to this method, the step of forming spacers is conducted collectively for each set of the plurality of semiconductor chips 22, 24 and 26 in each of the second stage and stages above over the substrate 10. As a result, the time to move the semiconductor chips after forming the spacers to the substrate 10 is omitted, and therefore semiconductor devices can be manufactured in the minimum number of manufacturing steps.

In the example shown in FIG. 6, the semiconductor chips 20, 22, 24 and 26 have the same external size. However, the present exemplary embodiment is not limited to this structure, and a plurality of semiconductor chips having different sizes can be mounted on thesubstrate 10. For example; an external shape of a semiconductor chip on the upper side can be made larger than an external shape of a semiconductor chip on the lower side.

Figure 7:
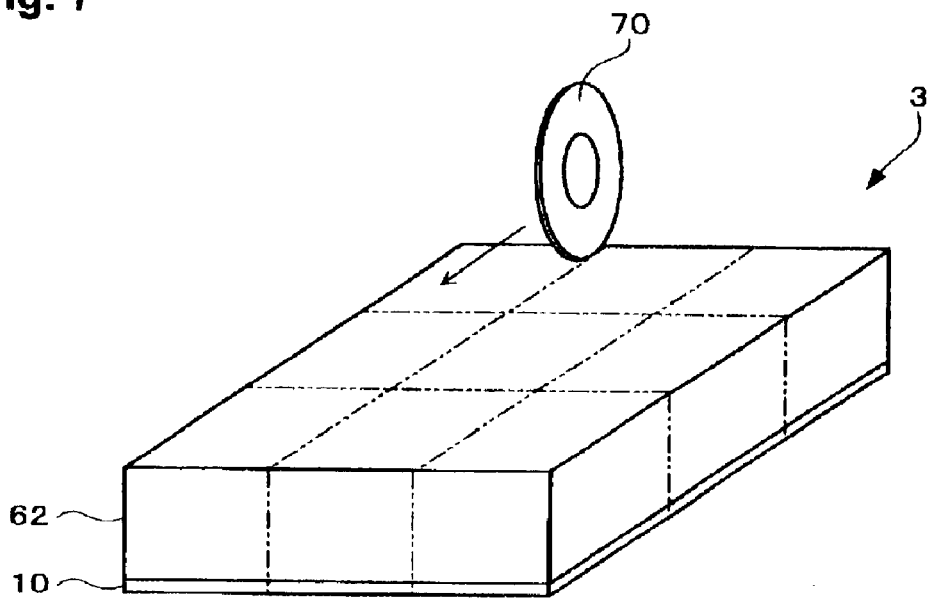
FIG. 7 is a schematic that shows a semiconductor device and the method for manufacturing a semiconductor device in accordance with the first exemplary embodiment of the present invention.

As shown in FIG. 7, the plural semiconductor chips 20, 22, 24 and 26 stacked on the substrate 10 are sealed. A sealing material may be, for example, a resin. As shown in FIG. 7, plural sets of the plural semiconductor chips 20, 22, 24 and 26 arranged in plane on the substrate 10 may be sealed together. A metal mold may be used for the sealing. For example, a transfer mold may be used to form a sealing section 62 on the substrate 10. In this case, the sealing material is called a mold resin. According to this method, for example, multiple sealing sections 62 can be simultaneously formed on plural substrates 10, respectively, which provides an excellent productivity.

Alternatively, a potting method may be employed to form the sealing section 62. In this case, the sealing material is generally a liquid resin (for example, potting resin).

The collective body 3 of semiconductor devices includes the substrate 10, and the plural sets of the multiple semiconductor chips 20, 22, 24 and 26, each including the multiple spacers 50, 52 and 54. The plural sets of the semiconductor chips 20, 22, 24 and 26 are arranged in plane on the substrate 10, and the semiconductor chips in each set are stacked in three dimensions. The spacers 50, 52 and 54 are provided between the semiconductor chips stacked in three dimensions. The plural sets of the multiple semiconductor chips 20, 22, 24 and 26 are covered by the sealing section 62 provided on the substrate 10.

As indicated in FIG. 7, a cutting jig (for example, a blade) 70 may be used to cut the sealing section 62 and the substrate 10. As a result, the collective body 3 is divided into a plurality of individual stacked type semiconductor devices 5 (see FIG. 8). By forming cutting lines (lines indicated by two-dot-and-dash lines in FIG. 7) in advance on the sealing section 62, positioning for the cutting work becomes easy.

Figure 8:
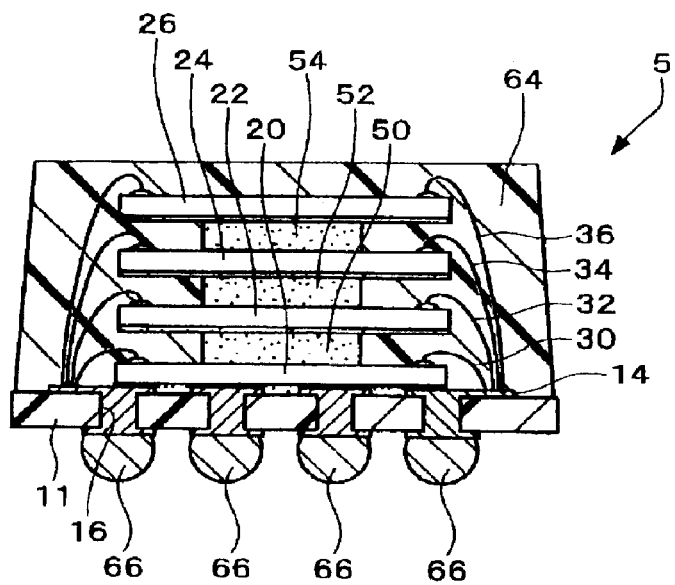
FIG. 8 is a schematic that shows a semiconductor device in accordance with the first exemplary embodiment of the present invention.

In this manner, as shown in FIG. 8, a semiconductor device 5 that is stacked can be formed. The semiconductor device 5 includes a substrate 11, the multiple semiconductor chips 20, 22, 24 and 26 stacked in three dimensions, and a sealing section 64.

As shown in FIG. 8, a plurality of external terminals 66 may be provided on the substrate 10 (or substrate 11). The external terminals 66 may be provided before or after the cutting step described above. When they are provided before the cutting step, external terminals 66 can be formed at one time on a plurality of semiconductor devices, which enhances productivity. The external terminals 66 may be solder balls. The external terminals 66 are electrically connected to the wiring pattern 14. The external terminals 66 may be provided at positions of the through holes 16.

By the method for manufacturing semiconductor devices in accordance with the present exemplary embodiment, the multiple spacers 50, 52 and 54 are formed collectively on the substrate 10, which enhances productivity. In other words, the time to individually mount the spacers 50, 52 and 54 on the corresponding semiconductor chips 20, 22 and 24 is omitted, and therefore the spacers can be quickly and readily formed.

A semiconductor device in accordance with an exemplary embodiment of the present invention includes a structure that can be derived from any of the specific details selected from the manufacturing methods described above, and the semiconductor device in accordance with the present exemplary embodiment is equipped with the effects described above. As shown in FIGS. 4, 7 and 8, the semiconductor device in accordance with the present exemplary embodiment is manufactured through the steps of the manufacturing method described above.

(Second Exemplary Embodiment)

Figure 9:
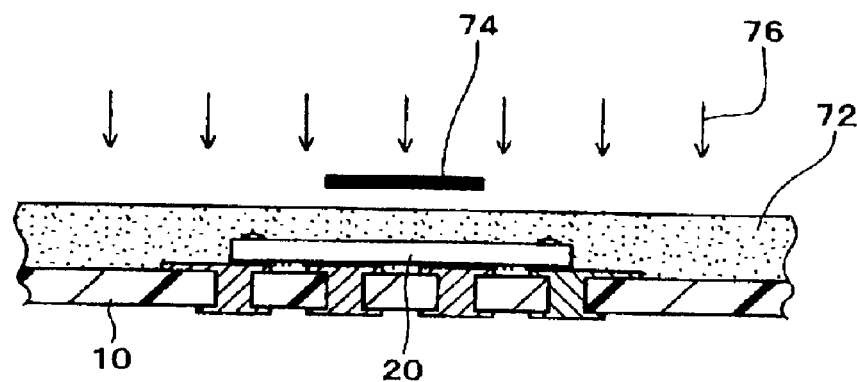
FIGS. 9(A)–9(C) are schematics that show a method for manufacturing a semiconductor device in accordance with a second exemplary embodiment of the present invention.
Figure 9:
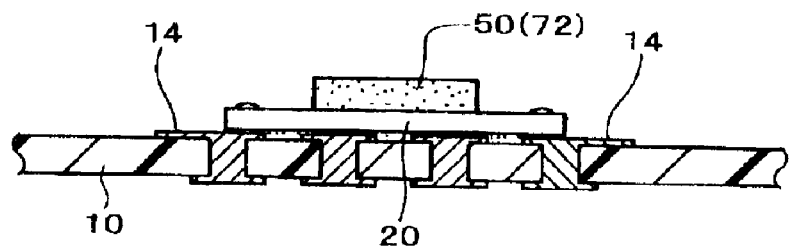
Figure 9:
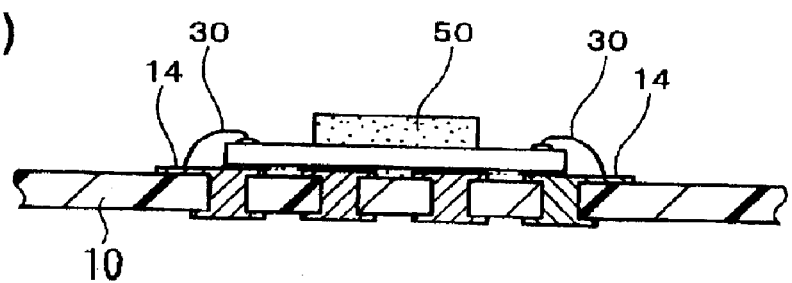

FIGS. 9(A)–9(C) show a method for manufacturing a semiconductor device in accordance with a second exemplary embodiment of the present invention. In this exemplary embodiment, a lithography technique (for example, photo-lithography technique) is employed to provide a plurality of spacers 50 at one time. As indicated in FIG. 9(A), the present step may be conducted before a wire-bonding step, or after a wire-bonding step in accordance with a modified exemplary embodiment. Any details of the present exemplary embodiment, which overlap with those of the exemplary embodiment described above, are omitted.

As shown in FIG. 9(A), a photosensitive material (resist) 72 is provided over a plurality of semiconductor chips 20. The material 72 may be provided in a manner to cover the plurality of semiconductor chips 20, or may be provided over the entire surface of the substrate 10. Alternatively, the material 72 may be divided and provided on each of the semiconductor chips 20. The material 72 may preferably be formed with a uniform thickness on each of the semiconductor chips 20. For example, a spin coat method may be employed to provide the material 72. By this method, the material 72 can be formed in a uniform thickness, and thus the height of the spacers 50 can be readily controlled. Alternatively, a dipping method or a spray coating method may be employed to provide the material 72.

As shown in FIG. 9(A), the material 72 is patterned. More specifically, a mask 74 is disposed over the material 72, and light energy 76 is irradiated. In other words, the material 72 is exposed through the mask 74. The shape of the mask 74 is determined by a patterning shape, and is inverted depending on whether the material 72 is a positive type or a negative type. In the example shown in FIG. 9(A), the material 72 has a positive type property, and the mask 74 covers a portion that is to be remained as the spacer 50. As an exemplary modification, a material having a negative type property may be used as the material 72. In this case, an opening in the mask 74 is disposed at a portion that is to be remained as the spacer 50. Thereafter, the material 72 is developed to thereby form the spacer at a specified location. A laser beam may be irradiated to remove unnecessary portions of the material 72.

In this manner, as shown in FIG. 9(B), the spacer 50 is provided on the semiconductor chip 20. The location of the spacer 50 to be provided is not limited. However, when a wire-bonding step is conducted later, the spacer 50 is provided at a location that avoids sections where electrical connections of wires are made. Then, as shown in FIG. 9(C), electrodes of the semiconductor chip 20 and the wiring pattern 14 on the substrate 10 are electrically connected by wires.

Alternatively, the step of forming the spacer 50 may be conducted after the wire-bonding steps. In this case, before the exposure step, the material 72 may be provided to cover the wires 30. When portions of the material 72 that cover the wires are to be removed, they may be removed by developing, or irradiating a laser beam. Portions of the material 72 that cover the wires may be remained as parts of the spacer 50.

By repeating the steps described above a plurality of times, a collective body of a plurality of semiconductor devices with stacked structure may be formed. In addition, they may be combined with the embodiments described above.

(Third Exemplary Embodiment)

Figure 10:
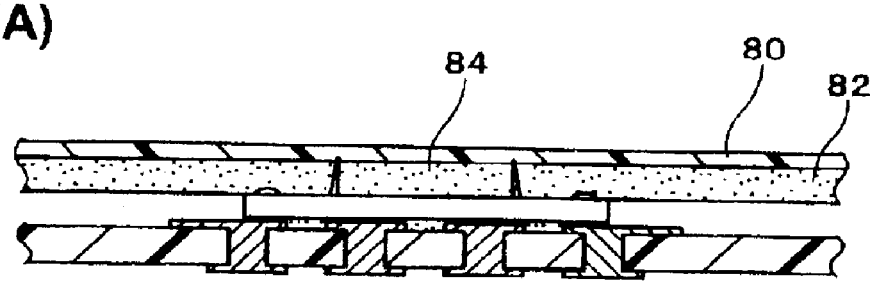
FIGS. 10(A)–10(C) are schematics that show a method for manufacturing a semiconductor device in accordance with a third exemplary embodiment of the present invention.
Figure 10:
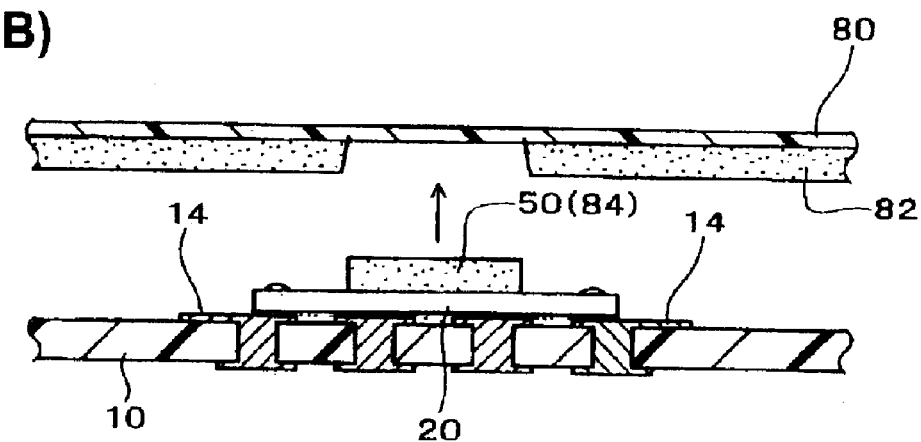
Figure 10:
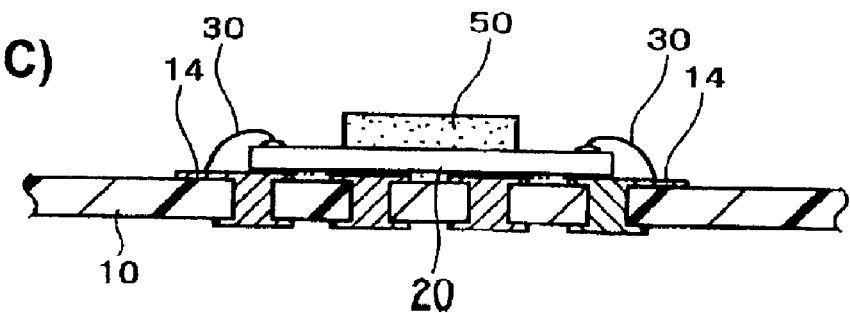

FIGS. 10(A)–10(C) show a method for manufacturing a semiconductor device in accordance with a third exemplary embodiment of the present invention. In this exemplary embodiment, a material (sheet) is transferred to form a plurality of spacers 50 at one time. As indicated in FIG. 10(A), the present step may be conducted before a wire-bonding step, or after a wire-bonding step in accordance with an exemplary modification. Any details of the present exemplary embodiment, which overlap with those of the exemplary embodiments described above, are omitted.

As shown in FIG. 10(A), a tape 80 and a sheet 82 are prepared. The sheet 82 is adhered to the tape 80. The tape 80 is a carrier member for the sheet 82. The tape 80 has an adhesive strength. The tape 80 may preferably be one that exerts the adhesive strength when the sheet 82 is carried, but may lose its adhesive strength at the time of transferring the sheet 82. The tape 80 may diminish its adhesive strength when energy is applied. For example, the tape 80 may have an ultraviolet hardening property in which its adhesive strength is weakened by irradiation of ultraviolet rays.

The sheet 82 is formed from a material for the spacers 50, and is in solid. As shown in FIG. 10(A), the sheet 82 may be provided entirely on one surface of the tape 80. In accordance with an exemplary modified embodiment, the sheet 82 may be provided partially on one surface of the tape 80. A plurality of sheets 82 each having the same shape of the spacer 50 may be provided on the tape 80. In this case, each of the sheets 82 may be provided at a position corresponding to any one of the semiconductor chips 20. As a result, by simply transferring the plural sheets 82, a plurality of spacers 50 can be formed.

The method of forming the sheet 80 is not limited. For example, a sheet 82 may be formed in an independent process, and then may be adhered to the tape 80. If possible, the sheet 82 may be formed on the tape 80 (see the steps described above). The sheet 82 may be formed by using a transfer mold.

As shown in FIG. 10(A), plural portions (portions that are to become spacers 50) 84 of the sheet 82 are transferred onto the semiconductor chips 20.

Before the transfer step, the adhesive strength between the tape 80 and the multiple portions 84 of the sheet 82 may preferably be made smaller than the adhesive strength between the tape 80 and other portions of the sheet. For example, energy may be irradiated partially (on the multiple portions 84) on the tape 80 to weaken the adhesive strength. This makes only the portions 84 of the sheet 82 to be readily separated from the tape 80.

Before the transfer step, as indicated in FIG. 10(A), the multiple portions 84 of the sheet 82 may be cut along their outlines. In other words, the sheet 82 is divided into the multiple portions 84 on the tape 80. In this case, the multiple portions 84 of the sheet 82 can be handled as a single unit if the tape 80 is not cut.

In the transfer step, the portion 84 of the sheet 82 may be pushed out through the tape 80 toward the semiconductor chip 20. Alternatively, adhesive may be provided at a location where the spacer 50 is provided such that the portion 84 of the sheet 82 may be adhered to the semiconductor chip 20.

As an exemplary modified embodiment, the entire sheet 82 may be transferred to the substrate 10. In this case, unnecessary portions (except the plural portions 82) of the sheet 82 are removed later.

Then, as shown in FIG. 10(B), the tape 80 is separated from the substrate 10 to thereby form a plurality of spacers 50 at one time on a corresponding plurality of semiconductor chips 20. Then, as shown in FIG. 10(C), electrodes of the semiconductor chip 20 and the wiring pattern 14 on the substrate 10 are electrically connected to one another by wires 30.

By repeating the steps described above a plurality of times, a collective body of a plurality of semiconductor devices with a stacked structure may be formed. In addition, they may be combined with the exemplary embodiments described above.

(Fourth Exemplary Embodiment)

Figure 11:
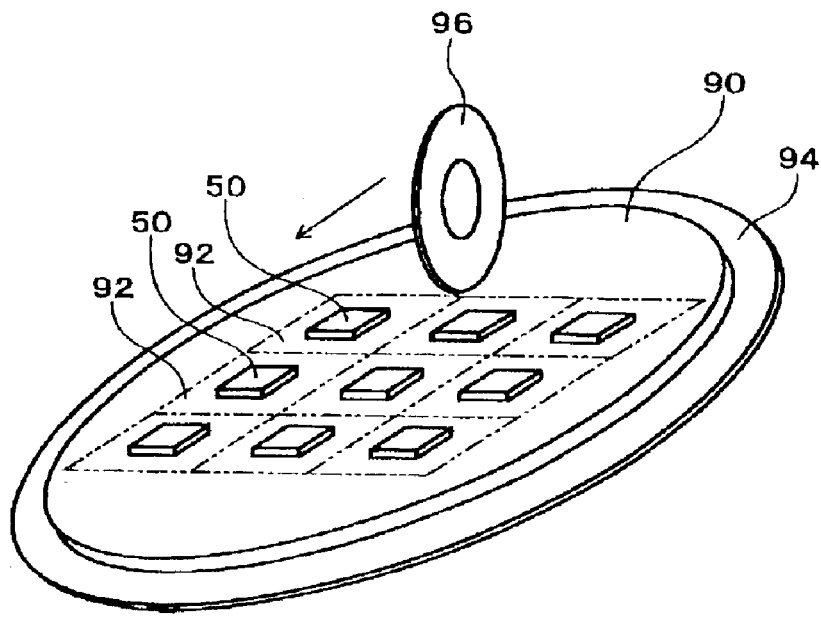
FIG. 11 is a schematic that shows a semiconductor wafer with spacers and its manufacturing method in accordance with a fourth exemplary embodiment of the present invention.

FIG. 11 shows a method for manufacturing a semiconductor device in accordance with a fourth exemplary embodiment of the present invention. In this exemplary embodiment, a plurality of spacers 50 are formed at one time on a semiconductor wafer 90. In the present exemplary embodiment, any one of the above described exemplary embodiments using the printing method, the lithography technique or the transfer method can be applied, and any details of the present exemplary embodiment, which overlap with those of the exemplary embodiments described above, are omitted.

As shown in FIG. 11, a semiconductor wafer 90 is prepared. Integrated circuits (not shown), each formed of transistors and memory elements are formed on the semiconductor wafer 90. The semiconductor wafer 90 includes a plurality of semiconductor elements 92, and may be cut along outlines of the respective semiconductor elements 92 to provide a plurality of semiconductor chips. The semiconductor wafer 90 includes a plurality of electrodes (not shown), and a passivation film (not shown) that covers end portions of the electrodes while avoiding central portions of the electrodes. In the present exemplary embodiment, the step of forming the spacers 50 is processed collectively in a wafer state.

The spacers 50 are formed by using any one of the methods in the exemplary embodiments described above. A semiconductor wafer with spacers in accordance with an exemplary embodiment of the present invention includes a semiconductor wafer 90 having a plurality of semiconductor elements, and spacers 50 provided on the respective semiconductor elements 92. The spacer 50 may be formed inside a surface of the semiconductor element 92.

After the step of forming the spacers, the semiconductor wafer 90 is divided into an individual semiconductor chips. A carrier tape 94 is adhered to a rear surface of the semiconductor wafer 90, and the semiconductor wafer 90 is cut by a cutting jig (for example, a blade) 96.

In this manner, a plurality of semiconductor chips with spacer can be formed. By stacking a plurality of the semiconductor chips with spacer, a semiconductor device with a stacked structure can be formed. As a result, since a semiconductor device with a stacked structure is formed through handling the semiconductor chips with spacer, independent handling of the spacers and semiconductor chips can be omitted in a stacking step.

Figure 12:
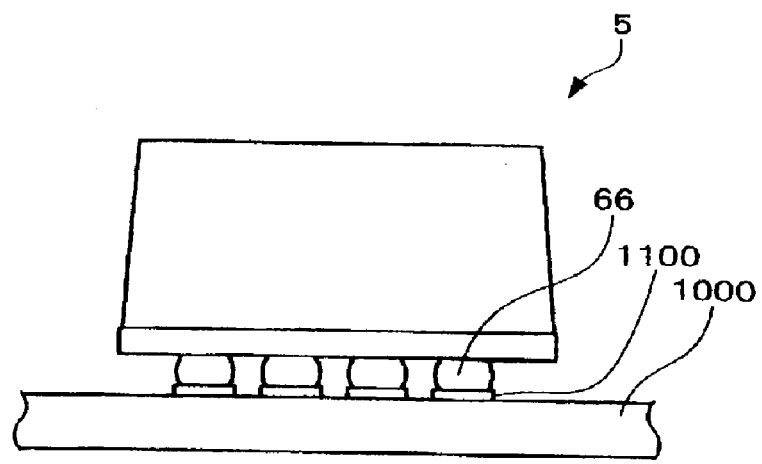
FIG. 12 is a schematic that shows a circuit substrate in accordance with an exemplary embodiment of the present invention.

FIG. 12 shows a circuit substrate to which the exemplary embodiment described above is applied. The semiconductor device 5 is mounted on a circuit substrate 1000. An organic substrate, such as, for example, a glass epoxy substrate can be used as the circuit substrate 1000. Wiring patterns 1100 formed of, for example, copper or the like are formed into a desired circuit on the circuit substrate 1000, and the wiring patterns 1100 and external terminals 66 of the semiconductor device are bonded to one another.

Figure 13:
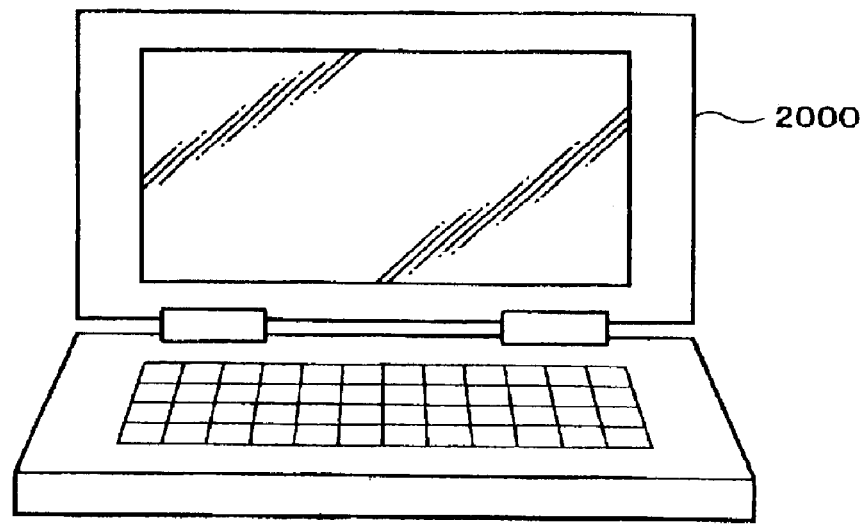
FIG. 13 is a schematic that shows an electronic apparatus in accordance with an exemplary embodiment of the present invention.
Figure 14:
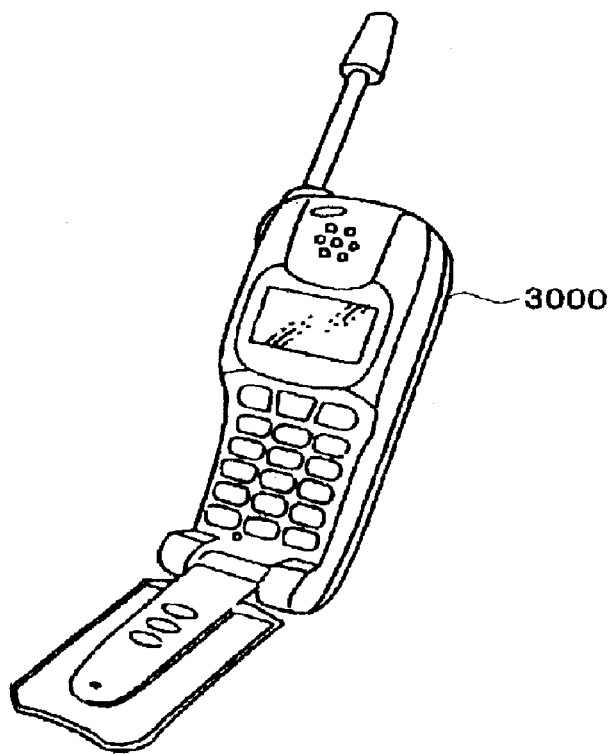
FIG. 14 is a schematic that shows an electronic apparatus in accordance with an exemplary embodiment of the present invention.

A notebook type personal computer 2000 shown in FIG. 13, and a portable telephone 3000 shown in FIG. 14 are exemplary electronic apparatuses incorporating the semiconductor devices in accordance with the exemplary embodiment of the present invention.

The present invention is not limited to the exemplary embodiments described above, and many modifications can be made. For example, the present invention may include compositions that are substantially the same as the compositions described in the exemplary embodiments (for example, a composition that has the same functions, the same methods and the results, or a composition that has the same objects and results). Also, the present invention includes compositions in which portions not essential in the compositions described in the exemplary embodiments are replaced with others. Also, the present invention includes compositions that achieve the same functions and effects or achieve the same objects as those of the compositions described in the exemplary embodiments. Furthermore, the present invention includes compositions that include related art, publicly known or later developed technology added to the compositions described in the exemplary embodiments.

What is claimed is:

1. A method for manufacturing a semiconductor wafer with spacers, comprising: forming multiple spacers on semiconductor elements on a semiconductor wafer, respectively, the forming of the multiple spacers being collectively conducted on the semiconductor wafer, and including: setting a mold having a plurality of holes and a plurality of concave portions to the wafer; providing paste that is a material for the spacers within the respective holes; and separating the mold from the wafer to thereby form the multiple spacers.

2. The method for manufacturing a semiconductor wafer with spacers according to claim 1, further including forming each spacer inside a surface of the semiconductor element.

3. The method for manufacturing a semiconductor wafer with spacers according to claim 1, further including utilizing a mold that has a dam section that stops flow of the paste; and providing the paste in a space surrounded by the dam section within the hole.

4. The method for manufacturing a semiconductor wafer with spacers according to claim 1, further including providing the paste flush with a surface of the mold.

5. The method for manufacturing a semiconductor wafer with spacers according to claim 1, further including providing paste that is a resin.

6. The method for manufacturing a semiconductor wafer with spacers according to claim 1, further including providing paste that has a thixotropic ratio that is greater than a thixotropic ratio of a mold sealing material.

7. The method for manufacturing a semiconductor wafer with spacers according to claim 1, the forming the spacers including:
 providing a photosensitive material for the spacers on the wafer; and
 exposing and developing the photosensitive material to thereby form the multiple spacers.

8. The method for manufacturing a semiconductor wafer with spacers according to claim 7, further including providing photosensitive material that has a positive type or negative type property.

9. The method for manufacturing a semiconductor wafer with spacers according to claim 7, further including providing photosensitive material by a spin coat method.

10. The method for manufacturing a semiconductor wafer with spacers according to claim 1, the forming the spacers including:
 adhering a sheet of material for the spacers to a tape; and
 transferring a plurality of portions of the sheet from the tape to the semiconductor wafer to thereby form the multiple spacers.

11. The method for manufacturing a semiconductor wafer with spacers according to claim 10, further including, before transferring, making an adhesive strength between the tape and the plurality of portions smaller than an adhesive strength between the tape and other portions of the sheet.

12. The method for manufacturing a semiconductor wafer with spacers according to claim 10, further including providing tape that has a property to be hardened by an ultraviolet ray.

13. The method for manufacturing a semiconductor wafer with spacers according to claim 10, further including, before transferring, irradiating an ultraviolet ray on the tape at regions thereof to which the plurality of portions of the sheet are bonded.

14. The method for manufacturing a semiconductor wafer with spacers according to claim 10, further including, before transferring, cutting the sheet over the tape along outlines of the plurality of portions of the sheet.

15. A method for manufacturing a semiconductor device, comprising: forming multiple spacers on a plurality of semiconductor chips that are arranged in a plane on a substrate, the forming the multiple spacers being collectively conducted on the substrate; and including setting a mold having a plurality of holes and a plurality of concave portions to the substrate; providing paste that is a material for the spacers within the respective holes; and separating the mold from the substrate to thereby form the multiple spacers.

16. The method for manufacturing a semiconductor device according to claim 15, further including forming each spacer inside a surface of the semiconductor chip.

17. The method for manufacturing a semiconductor device according to claim 15, further including utilizing a mold that has a dam section that stops flow of the paste; and providing paste in a space surrounded by the dam section within the hole.

18. The method for manufacturing a semiconductor device according to claim 17, further including providing paste flush with a surface of the mold.

19. The method for manufacturing a semiconductor device according to claim 15, further including providing paste that is a resin.

20. The method for manufacturing a semiconductor device according to claim 15, further including providing paste that has a thixotropic ratio that is greater than a thixotropic ratio of a mold sealing material.

21. The method for manufacturing a semiconductor device according to claim 15, the forming the spacers including:
providing a photosensitive material for the spacers on at least a plurality of the semiconductor chips; and
exposing and developing the photosensitive material to thereby form the multiple spacers.

22. The method for manufacturing a semiconductor device according to claim 21, further including providing photosensitive material that has a positive type or negative type property.

23. The method for manufacturing a semiconductor device according to claim 21, further including providing photosensitive material by a spin coat method.

24. The method for manufacturing a semiconductor device according to claim 15, the forming the spacers including:
adhering a sheet of material for the spaces to a tape; and
transferring a plurality of portions of the sheet from the tape to the semiconductor chips to thereby form the multiple spacers.

25. The method for manufacturing a semiconductor device according to claim 24, further including, before transferring, making an adhesive strength between the tape and the plurality of portions smaller than an adhesive strength between the tape and other portions of the sheet.

26. The method for manufacturing a semiconductor device according to claim 24, further including providing tape that has a property to be hardened by an ultraviolet ray.

27. The method for manufacturing a semiconductor device according to claim 26, further including, before transferring, irradiating an ultraviolet ray on the tape at regions thereof to which the plurality of portions of the sheet are bonded.

28. The method for manufacturing a semiconductor device according to claim 24, further including, transferring, cutting the sheet over the tape along outlines of the plurality of portions of the sheet.

29. The method for manufacturing a semiconductor device according to claim 15, further including wire-bonding electrodes of the semiconductor chips to wiring patterns of the substrate.

30. The method for manufacturing a semiconductor device according to claim 29, further including, before wiring bonding, conducting the forming of the spacers.

31. The method for manufacturing a semiconductor device according to claim 29, further including, after wiring bonding, conducting the forming of the spacers.

32. The method for manufacturing a semiconductor device according to claim 15, further including forming a collective body of a plurality of stacked type semiconductor devices by repeatedly forming the spacers for a plurality of semiconductor chips in a second stage or over that are stacked over the substrate.

33. The method for manufacturing a semiconductor device according to claim 32, further including forming a sealing section that seals a plurality of the stacked semiconductor chips on the substrate.

34. The method for manufacturing a semiconductor device according to claim 33, further including cutting the sealing section and the substrate, after sealing, to form a plurality of individual stacked type semiconductor devices.

* * * * *